(12) United States Patent
Yoshida et al.

(10) Patent No.: US 8,183,093 B2
(45) Date of Patent: May 22, 2012

(54) METHOD OF MANUFACTURING A SEMICONDUCTOR DEVICE BY LAMINATION

(75) Inventors: Naoko Yoshida, Ibaraki (JP); Takashi Oda, Ibaraki (JP); Shigenori Morita, Ibaraki (JP)

(73) Assignee: Nitto Denko Corporation, Ibaraki-shi (JP)

( * ) Notice: Subject to any disclaimer, the term of this patent is extended or adjusted under 35 U.S.C. 154(b) by 131 days.

(21) Appl. No.: 12/732,767

(22) Filed: Mar. 26, 2010

(65) Prior Publication Data
US 2010/0248428 A1    Sep. 30, 2010

(30) Foreign Application Priority Data

Mar. 27, 2009   (JP) ................................. 2009-080023

(51) Int. Cl.
*H01L 21/00*      (2006.01)

(52) U.S. Cl. ........ 438/118; 438/121; 438/458; 438/616; 257/686; 257/690; 257/E21.499

(58) Field of Classification Search ........................ None
See application file for complete search history.

(56) References Cited

U.S. PATENT DOCUMENTS

| | | | |
|---|---|---|---|
| 5,448,014 A * | 9/1995 | Kong et al. ................... | 174/539 |
| 6,326,701 B1 | 12/2001 | Shinogi et al. | |
| 6,391,220 B1 * | 5/2002 | Zhang et al. .................... | 216/67 |
| 6,803,324 B2 * | 10/2004 | Ogawa et al. ................. | 438/761 |
| 2003/0100145 A1 * | 5/2003 | Fork .............................. | 438/117 |
| 2004/0056344 A1 * | 3/2004 | Ogawa et al. ................. | 257/686 |
| 2005/0269681 A1 * | 12/2005 | Asahi et al. ................... | 257/686 |
| 2006/0220173 A1 * | 10/2006 | Gan et al. ...................... | 257/528 |
| 2008/0308922 A1 * | 12/2008 | Zhang et al. ................. | 257/690 |

FOREIGN PATENT DOCUMENTS
JP      2000-243754 A      9/2000

* cited by examiner

*Primary Examiner* — Evan Pert
*Assistant Examiner* — Andres Munoz
(74) *Attorney, Agent, or Firm* — Leydig, Voit & Mayer, Ltd.

(57) ABSTRACT

A wiring circuit layer 2 having at least a wiring part and an insulating part, whose top and bottom surfaces (20A, 20B) is adhesive surfaces, is formed on a metal support substrate 1 in a way such that the layer 2 can be peeled from the substrate 1. Exposed in the first adhesive surface 20A of the wiring circuit layer 2 is a first connecting conductor part 21, which is connectable with an electrode 31 of a first semiconductor element 3 in a wafer state. After the wiring circuit layer 2 is laminated on and connected to the element 3, the metal support substrate 1 is peeled from the wiring circuit layer 2 to yield a semiconductor device 4. Another element may be connected to the other adhesive surface 20B exposed upon the peeling.

8 Claims, 7 Drawing Sheets

(a)

(b)

(c)

(a)

(b)

(a)

(b)

(a)

(b)

(c)

(d)

(e)

(f)

(g)

(h)

(f)

(g)

(h)

METHOD OF MANUFACTURING A SEMICONDUCTOR DEVICE BY LAMINATION

FIELD OF THE INVENTION

The present invention relates to a manufacturing method for a semiconductor device comprising a semiconductor element connected to at least one main surface of a wiring circuit layer, more specifically to a manufacturing method for a semiconductor device wherein both the top and back main surfaces of the wiring circuit layer are adhesive surfaces, and another semiconductor element can be connected to the other main surface.

BACKGROUND OF THE INVENTION

Semiconductor elements configured with various semiconductor materials (hereinafter also simply referred to as "elements"), such as IC using silicon semiconductor and organic EL elements using organic semiconductors, are usually produced by repeatedly forming a matrix of multiple elements on a wafer substrate, then dicing the substrate into individual elements known as semiconductor chips (also referred to as bare chips).

In the description below, a semiconductor element formed thereon (state prior to dicing) is also referred to as "a semiconductor wafer", and the state prior to dicing is also referred to as "a wafer state". Likewise, a diced semiconductor chip is also simply referred to as "a chip", and the state after dicing is also referred to as "a chip state".

In addition to a basic semiconductor element structure, various wiring structures are fabricated in the element while in the wafer state, in order to add sophisticated functions and for other purposes. Such wiring structures include, for example, a redistribution layer, conductive path (through hole via) that allow the element-side face and back face to communicate with each other electrically through a wafer substrate, and the like.

As disclosed in JP-A-2000-243754, for example, an aluminum electrode (an electrode pad included in an element as a semiconductor element structure) is formed, after which an insulating layer, a Cu-plated layer and the like are sequentially formed thereon, whereby a redistribution layer is formed.

After being provided with a wiring structure and divided into chips, any element serves as a semiconductor device with a connecting conductor that facilitates connection to, and mounting of, external conductors (external circuits and the like), compared with the original element, which simply has an is electrode exposed.

For example, by providing a redistribution layer, aluminum electrodes of the element and conductors on an external circuit for mounting the element can easily be connected, even if they differ from each other in size or pitch.

Connection terminals can be formed on the back face of a wafer substrate by providing through hole vias that penetrate the wafer substrate in the direction of the substrate thickness.

Through investigations of such wiring layer to be added to a semiconductor element, the present inventors found that there was a room for further improvement in the manufacturing cost relating to the wiring layer, and identified it as a problem to be solved by the present invention.

Accordingly, processing for forming a redistribution layer directly on a semiconductor wafer is painstaking because of the necessity for building a redistribution layer on each semiconductor wafer. The present inventors took note of the fact that there is a room for reducing the manufacturing cost for forming such a redistribution layer, although this had not been deemed a problem. If a redistribution layer formed is found to be of unacceptable quality, and even if the semiconductor wafer obtained is of acceptable quality as a whole, disposal of the semiconductor wafer as well is unavoidable, which increases the manufacturing cost, because the redistribution layer has already been formed monolithically on the semiconductor wafer.

Problems to be solved by the present invention reside in resolving the above-described problem of which the present inventors took note and to provide a manufacturing method that enables a reduction of the manufacturing cost for redistribution layers conferred to semiconductor elements.

SUMMARY OF THE INVENTION

The present inventors extensively investigated to solve the above-described problems, and found that by forming a redistribution layer as a wiring circuit layer independent from a semiconductor wafer, and providing the wiring circuit layer with a support layer of metal in a way such that the support layer can be separated, the above-described problem can be solved. The inventors conducted further investigations based on this finding, and have developed the present invention.

Accordingly, the present invention has the following features:

(1) A manufacturing method for a semiconductor device having a laminated structure wherein a first semiconductor element is laminated and connected to at least one of both main surfaces of a wiring circuit layer, the wiring circuit layer comprising at least a wiring part and an insulating part, wherein;

the insulating part comprising a first adhesive layer and a second adhesive layer, the first adhesive layer being disposed on one main surface side of the wiring circuit layer and the second adhesive layer being disposed on the other main surface side, and the both main surfaces form a first adhesive surface and a second adhesive surface by the presence of first adhesive layer and the second adhesive layer, respectively, and a first connecting conductor part being exposed in at least the first adhesive surface to which the first semiconductor element is connected in a way such that an electrode of the element can be connected, and the first connecting conductor part constitutes a portion of the wiring part of the wiring circuit layer or is connected to the wiring part via a conductive path;

the manufacturing method comprises the steps of:

laminating a wiring circuit layer on a first metal support substrate in a way such that the wiring circuit layer can be peeled from the substrate, and that the first adhesive surface is provided on the opposite side of the wiring circuit layer from the substrate;

bonding the first semiconductor element in a wafer state to the first adhesive surface, and simultaneously connecting an electrode of the element to the first connecting conductor part, after the laminating step; and peeling the metal support substrate from the wiring circuit layer after the bonding step.

(2) The method according to (1) above, wherein the insulating part of the wiring circuit layer has a laminated structure comprising the first adhesive layer, the second adhesive layer and a base insulating layer between the adhesive layers, (i) in the laminating step, forming the base insulating layer on a second metal support substrate, forming the wiring circuit part and the second adhesive layer covering the wiring circuit part, laminating the first metal support substrate peelably on the second adhesive surface which is the upper surface of the second adhesive layer, peeling the second metal support substrate, forming the first adhesive layer on the exposed surface of the base insulating layer, and then forming the first connecting conductor part in the first adhesive surface which is the lower surface of the first adhesive layer, (ii) in the bonding step, bonding the first semiconductor element in a wafer state to the first adhesive surface, and simultaneously connecting the electrode of the element to the first connecting conductor part.

(3) The method according to (1) above, wherein a second connecting conductor part is exposed in the second main surface of the wiring circuit layer in a way such that an electrode of a second semiconductor element can be connected, and the second connecting conductor part is a portion of the wiring part of the wiring circuit layer or is connected to the wiring part via a conductive path, and the process further comprises a second bonding step after the peeling step, in the second bonding step, bonding the second semiconductor element in a wafer state or chip state to the second adhesive surface exposed in the peeling step, and simultaneously connecting the electrode of the second semiconductor element to the second connecting conductor part.

(4) The method according to (1) above, wherein the first adhesive layer and the second adhesive layer are made of an adhesive that requires heating during adhesion, and the second adhesive layer is made of an adhesive that does not lose bonding capability even by the heating during the preceding bonding of the first semiconductor element to the first adhesive layer.

(5) The method according to (1) above, wherein a release layer is present between the first metal support substrate and the wiring circuit layer, whereby the wiring circuit layer can be peeled from the first metal support substrate.

(6) The method according to (5) above, wherein the release layer has been formed in a way such that it is peeled from the wiring circuit layer with ease, and is not peeled with ease from the first metal support substrate, whereby the release layer can be peeled, together with the first metal support substrate, from the wiring circuit layer.

(7) The method according to (5) above, wherein the release layer is made of a polyimide.

(8) The method according to (5) above, wherein the release layer is made of one material selected from among metals, metal oxides, and inorganic oxides.

(9) The method according to (1) above, wherein the wiring circuit layer serves as a redistribution layer for the semiconductor element connected thereto.

and thereafter connecting the element to the exposed second main surface as well.

Numerical codes used in these drawings denote the following: 1; first metal support substrate, 2; wiring circuit layer, 21; first connecting conductor part, 22; second connecting conductor part, 3; first semiconductor elements in a wafer state, 4; semiconductor device.

DETAILED DESCRIPTION OF THE INVENTION

According to the manufacturing method of the present invention, the above-described problem is solved as described below.

The manufacturing method of the present invention may be described as a method wherein a redistribution layer, previously prepared as a wiring circuit layer separately from a semiconductor element, is laminated on an element in a wafer state, such as a semiconductor wafer, to obtain a semiconductor device.

A large number of semiconductor devices of large areas that can include a large number of wafers can easily be produced on a roll-to-roll basis by separately producing wiring circuit layers, and therefore, the manufacturing cost is even lower than when a redistribution layer is formed directly on each semiconductor wafer.

Also, a metal support substrate provided for a wiring circuit layer in a way such that the circuit layer can be peeled confers adequate rigidity to the wiring circuit layer to increase the handleability until the wiring circuit layer is laminated on a semiconductor wafer, thus contributing to manufacturing cost reduction.

The manufacturing method of the present invention makes it possible to select wiring circuit layers of a non-defective only to connect the element in a wafer state, so that useless disposal of non-defective elements is avoided.

Because the both main surfaces of a wiring circuit layer are adhesive surfaces, the semiconductor device obtained according to the present invention has adhesive surfaces and is useful in mounting to an external circuit.

Element mounting density can be increased by exposing connecting conductor parts to the both main surfaces of the wiring circuit layer in a way such that elements can be respectively connected, peeling the metal support substrate, and thereafter connecting the element to the exposed second main surface as well.

Hereinafter, the manufacturing method of the present invention is described with reference to specific examples. As used herein, the terms indicating upward or downward, such as "upper" and "upper surface", are merely to explain the positional relationship of layers and elements in the laminating direction, and are not to be construed as limiting the actual vertical position of the semiconductor device or the mutual vertical positional relationship between the wiring circuit layer and the semiconductor element.

Figure 1:
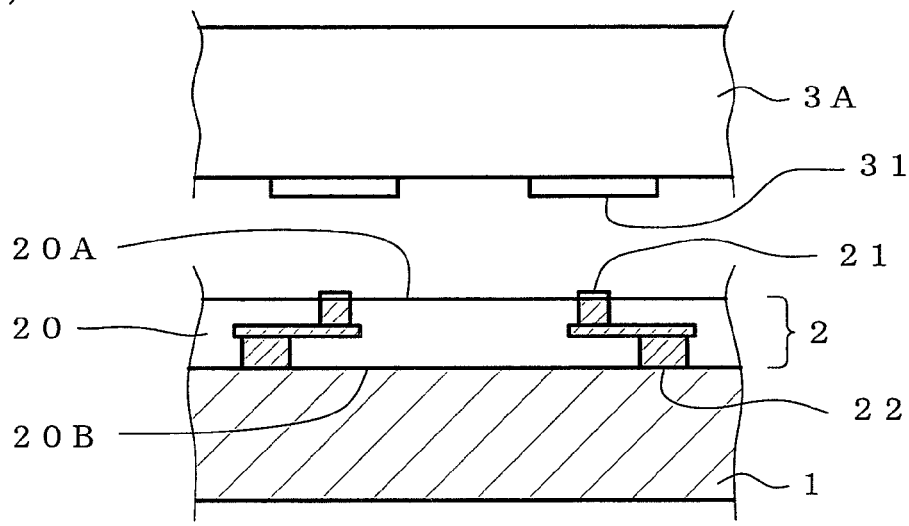
FIG. 1 shows schematic diagrams of how a wiring circuit layer is formed through each step to explain the manufacturing method of the present invention. Hatching is given as appropriate to distinguish different regions (the same applies to other drawings).
Figure 1:
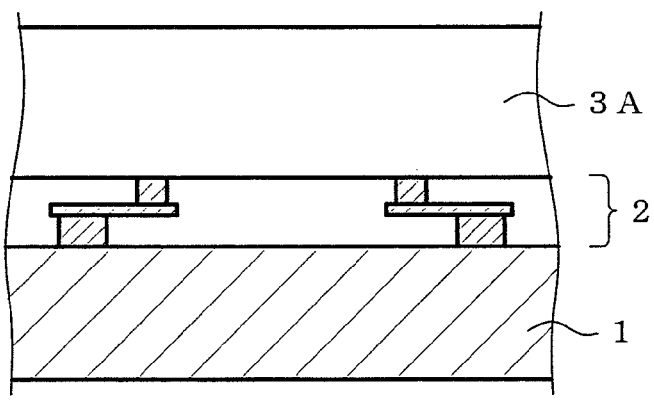
Figure 1:
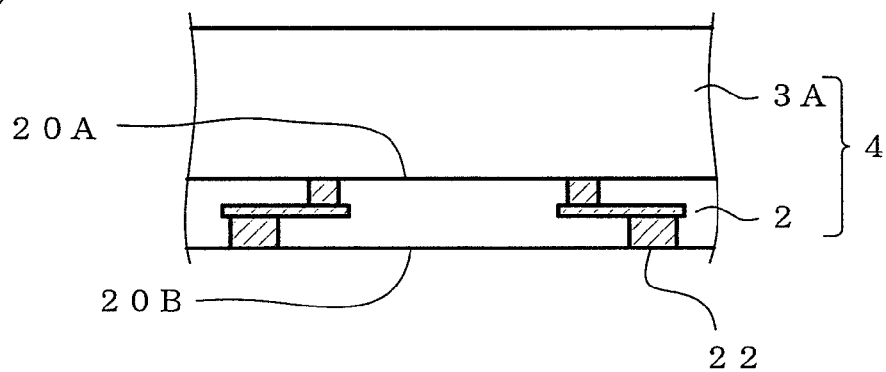

FIG. 1 schematically shows how a product is formed through each step in the manufacturing method of the present invention. The illustrated layer structures and connection patterns in the wiring circuit layer have been simplified for the sake of explanation.

As mentioned herein, "semiconductor elements in a wafer state" include not only semiconductor wafers of multiple semiconductor elements while in the form of a matrix on a wafer substrate, but also those prepared by checking multiple elements in the semiconductor wafer by quality inspection, once dicing the wafer into individual chips, thereafter rearranging only those chips of acceptable quality on a sheet of the same shape as the wafer substrate. In the description below, "a semiconductor element in a wafer state" is also referred to as "a wafer-like element".

The manufacturing method has at least a laminating step for forming a wiring circuit layer peelably on a first metal support substrate, an bonding step for connecting a wafer-like element, and a peeling step for peeling the first metal support substrate from the wiring circuit layer.

The wiring circuit layer has at least a wiring part (i.e., a patterned conductive layer) and an insulating part that fills therebetween, and serves as a redistribution layer for the element connected. The structure thereof is described in detail below.

In the manufacturing method, a lamination is first formed between a first metal support substrate 1 and a wiring circuit layer 2 in a laminating step, as shown in FIG. 1(a).

There are roughly two methods of forming the lamination. In one method, as described in an Example with reference to FIGS. 4 and 5, a wiring circuit layer is simply laminated peelably on a first metal support substrate in a laminating step. In the other method, as described in an Example with reference to FIGS. 6 and 7, a second metal support substrate as a tentative substrate is provided, all or some of the layers of the wiring circuit layer is laminated peelably thereon, and a first metal support substrate is further laminated thereon, after which the second metal support substrate is peeled and removed, to thereby obtain a lamination permitting separation of the first metal support substrate and the wiring circuit layer.

In the former method, the exposed main surface may be further covered with a release liner to be removed before connection to a semiconductor element. In the latter method, the second metal support substrate may be used as a release liner.

When an element (second element) is also mounted to the second main surface (the second adhesive surface) that becomes exposed by the peeling in the peeling step, it is necessary that a second connecting conductor part be formed in the second adhesive surface as well in a pattern and exposure manner such that the second element can be connected. Although the second element is preferably in a wafer state, it may be in a divided chip state. The second connecting conductor part for connection of the second element, like the above-described first connecting conductor part, is any one that constitutes a portion of the wiring part of the wiring circuit layer or is connected to the wiring part via a conductive path.

Next, in the bonding step of the manufacturing method, as shown in FIGS. 1(a) and (b), a wafer-like element 3A is bonded to the exposed main surface (the first adhesive surface) 20A of the wiring circuit layer 2, and an electrode 31 of the element 3A is simultaneously connected to the first connecting conductor part 21 exposed in the main surface 20A.

In FIG. 1(a), the first connecting conductor part 21, the electrode 31 and the like are illustrated as they are protruded more than in the actual state, so as to indicate their positions clearly. In FIG. 1, only one element on the wafer is illustrated in a magnified view. In the actual settings, however, multiple elements are arranged in a matrix form on a substrate of wafer scale. In FIG. 1(b), the protrusions of each of the first connecting conductor part 21 and the electrode 31 are omitted. In the actual step, the semiconductor element and the wiring circuit layer are brought into gapless adhesion by pressing.

Furthermore, in the peeling step of the manufacturing method, as shown in FIG. 1(c), the first metal support substrate 1 is peeled from the wiring circuit layer 2 to expose the second main surface (the second adhesive surface) 20B of the wiring circuit layer, whereby a desired semiconductor device 4 is obtained.

In this stage, the semiconductor device is in a wafer form, therefore, semiconductor devices in the form of individual chips are obtained by dicing. After peeling the first metal support substrate from the wiring circuit layer, a processing such as providing a solder ball may be subjected to the wiring circuit layer prior to dicing.

the semiconductor device may be any one that permits lamination on a wiring circuit layer and connection to a connecting conductor part thereof; examples include conventionally known elements such as those of simple structure like single light-emitting element, arrays comprising an assembly thereof, organic semiconductor element, IC, processor with various operation circuits integrated therein, memory, photosensor, and image sensor, as well as multi-chip module, MEMS (micro-electro-mechanical systems; devices wherein machine components, sensors, actuators, electronic circuits and the like are integrated on a substrate) and the like.

The wafer substrate to form a semiconductor element thereon may be any substrate for semiconductor elements; examples include semiconductor crystal substrate such as of silicon, as well as insulating crystal substrate, glass substrate, substrate made of an organic compound, and the like. Of these substrates, the most versatile ones are silicon crystal substrates (silicon wafers).

A gold stud bump, an underbump metal (UBM) and the like are formed in the electrodes of the element. The UBM is exemplified by Ni/Au layers formed by electroless plating (Ni is on the undercoat side; the same applies below, i.e., the undercoat side of the lamination is indicated first), Ti/Cu layers, Ti/W/Cu layers, and Ti/Ni/Cu layers formed by sputtering, and the like.

Conventionally known methods can be used to connect the electrode of the element to the connecting conductor part of the wiring circuit layer; examples include Au—Au bonding, Au stud bump-solder bonding, solder bump bonding, bonding using Ag paste, and bonding using ACF (Anisotropic Conductive Film) or NCF (Non-Conductive Film). To meet a demand for fine pitches, Au stud bump-solder bonding is suitably used. If a gap is produced between the device and the wiring circuit layer because of a bump height and the like, an underfill material or the like may be filled.

In the case of a structure wherein a through hole via that penetrates a wafer substrate in the thickness direction is present in the substrate, and an electrode of a semiconductor element is communicable to the back face side of the wafer substrate through the through hole via, a wiring circuit layer may be laminated on the back face side of the wafer substrate, and the connecting conductor part of the wiring circuit layer may be connected to the terminal of the through hole via. Also in this case, the wiring circuit layers may be used to connect the electrode of the element and the through hole via not on the back face side of the wafer substrate, but on the element side, and the wiring circuit layer may be laminated on both the back face side and the element side.

The wiring circuit layer comprises at least a wiring part (specifically a conductive layer formed as a circuit pattern) and an insulating part that covers the upper side, lower side and surroundings of the wiring part entirely.

Figure 2:
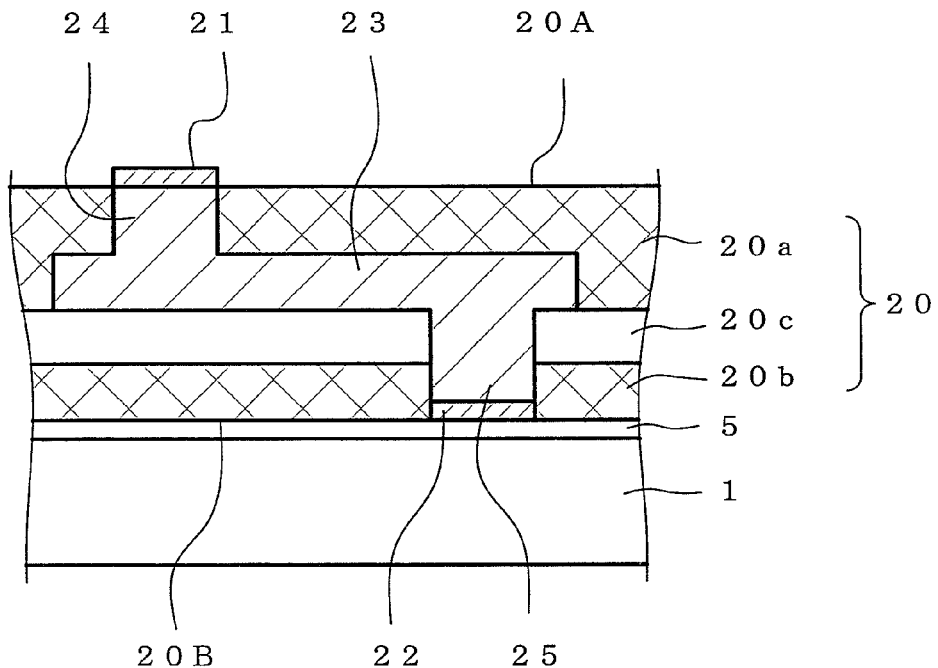
FIG. 2 shows various inner structure and connection structure of conductors in a wiring circuit layer formed by the present invention.
Figure 2:
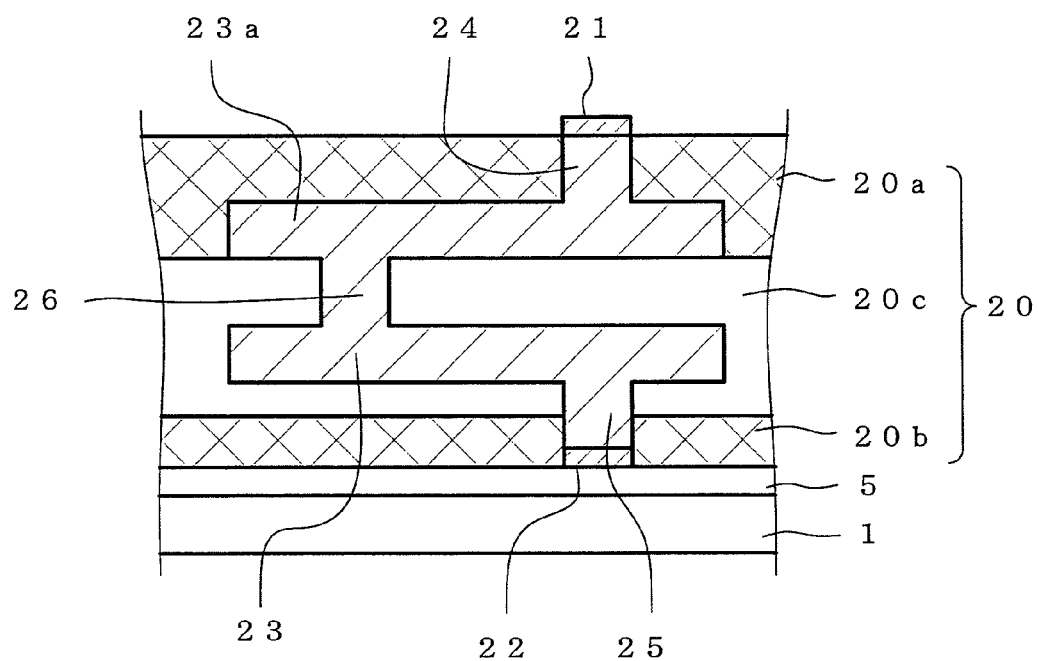

An example structure of the wiring circuit layer is shown in FIG. 2. In the insulating part, the first adhesive layer 20a is present on the side of the first main surface 20A, and the second adhesive layers 20b is present on the side of the second main surface 20B, whereby these two main surfaces function as adhesive surfaces. As shown in FIG. 1, a first connecting conductor part 21 is exposed to the first adhesive surface (20A in FIG. 1) for connecting the first element 3A in a way such that an electrode 31 of the element 3A can be connected. In the example shown in FIG. 1, the first connecting conductor part 21 is connected to a conductive layer which is a wiring part therein via a conductive path. The first connecting conductor part may be the wiring part exposed to the first adhesive surface.

The wiring circuit layer serves as a redistribution layer for the element connected thereto. When an element is connected to each of the first and the second adhesive surface of the wiring circuit layer, the wiring circuit layer serves as a common redistribution layer for the two elements.

Although the inner structure and conductor connection structure of the wiring circuit layer are not particularly limited, a useful basic structure is exemplified in FIG. 2.

In the structure of FIG. 2, the wiring circuit layer has an insulating layer 20 as the insulating part, the insulating layer 20 constituting a laminated structure having a first adhesive layer 20a, a base insulating layer 20c, and a second adhesive layer 20b. In the example shown in FIG. 2(a), the conductive layer is provided as a single layer. In the example shown in FIG. 2(b), the conductive layer is in the form of two layers separated from each other in the thickness direction of the wiring circuit layer.

On the first adhesive surface (which is first main surface 20A of the wiring circuit layer) of the insulating layer 20, a first connecting conductor part 21 is provided for connection to an first element electrode. On the second surface (which is the second main surface 20B of the wiring circuit layer), a second connecting conductor part 22 is provided for connection to an external conductor (e.g., a pad of an external circuit for mounting of the semiconductor device) or connection to a second element; the first and the second connecting conductor parts (21, 22) are connected to a conductive layer 23 provided in the insulating layer 20. Regarding the two connecting conductor parts (21, 22), the connection pattern may be determined variously depending on the actual functions of the element and the roles of the electrode; for example, particular components may be connected to each other via a conductive layer.

Referring to the example shown in FIG. 2(a), a conductive layer 23 is formed in the specified connection pattern in an insulating layer 20, wherein the tip of a conductive path (metal column) 24 extending from the conductive layer 23 to the first main surface 20A constitutes the first connecting conductor part 21, and the tip of a conductive path (metal column) 25 extending from a conductive layer 23 to the second main surface 20B constitutes the second connecting conductor part 22. In the example illustrated, a metal film is formed in the tip of each conductive path, for achieving better electrical connection and increasing the corrosion resistance. More specifically, in the example shown in FIG. 2(a), the conductive layer 23 is formed on the upper surface of a base insulating layer 20c, the first adhesive layer 20a is formed over the conductive layer 23; this laminated structure makes the conductive layer 23 embedded in the insulating layer 20.

Referring to the example shown in FIG. 2(b), the conductive layer has a conductive layer 23a on the first element side and a conductive layer 23b on the first metal support substrate. The conductive layers 23a and 23b are spaced, and a conductive path 26 provided at the specified position between the two layers connects these conductive layers. More specifically, in the example shown in FIG. 2(b), the conductive layer 23b is embedded in the base insulating layer 20c, the conductive layer 23a on the element side, like in the embodiment shown in FIG. 2(a), is provided on the upper surface of the base insulating layer 20c, and covered by an adhesive layer 20a.

A plurality of conductive layers can be formed in the form of an upper base insulating layer and a lower base insulating layer, by, for example, repeating as required the steps of:
forming a base insulating layer on the lowermost layer side;
forming a first conductive layer thereon;
forming a second base insulating layer over the first conductive layer to embed the first conductive layer;
making an opening at a specified position in the upper surface of the second base insulating layer to expose the first conductive layer;
filling the opening with a conductive material to make a conductive path; and
forming a second conductive layer on the upper surface of the second base insulating layer.

Figure 3:
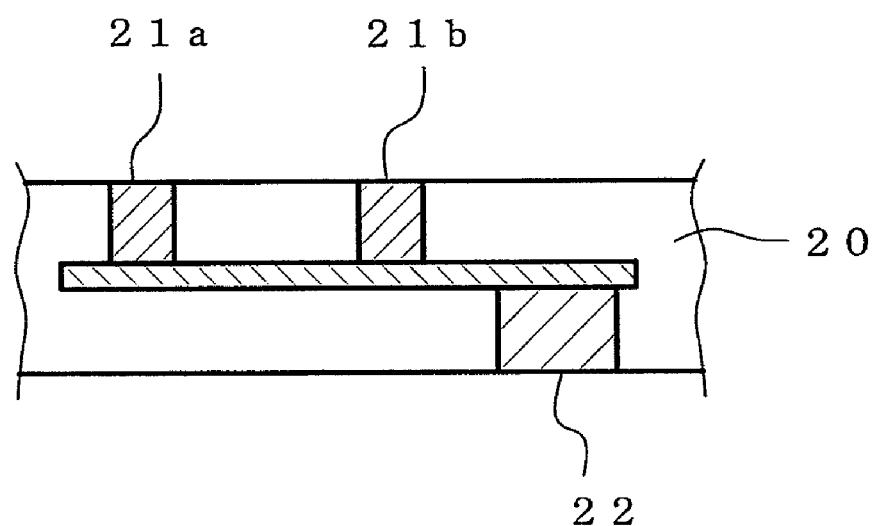
FIG. 3 shows schematic diagrams in greater detail of an example inner structure of a wiring circuit layer.
Figure 3:
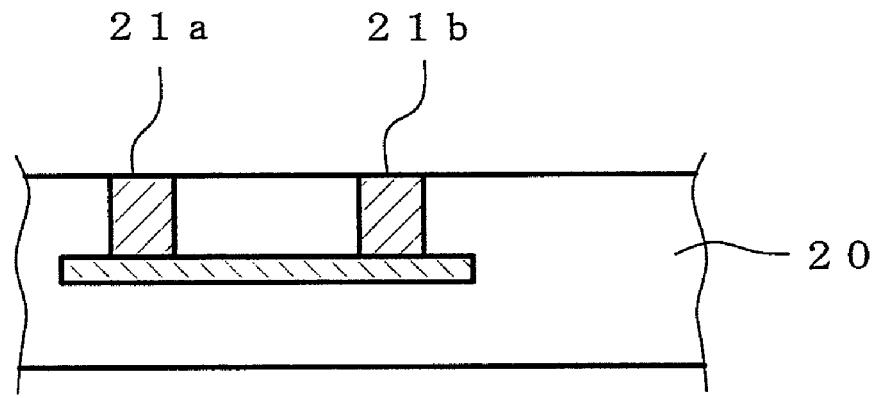

In addition to the typical example structure shown in FIG. 2, other examples include a structure wherein specific first connecting conductor parts 21a and 21b are connected to each other (FIG. 3(a)), a structure wherein the first connecting conductor part is connected to a plurality of the second conductor parts (not illustrated), a structure wherein specific first connecting conductor parts 21a and 21b are connected to each other in the layer, and are not connected to the second connecting conductor part in the second surface of the wiring circuit layer (FIG. 3(b)), and the like; the pattern of the connection structure may be freely varied and combined according to the intended use.

The wiring in the wiring circuit layer (a conductive layer extending laterally in the circuit layer) may be a single layer or multiple layers as described above.

The arrangement patterns of individual wiring circuit layers contained in the wiring circuit layer prior to dicing may be any ones that correspond to the element array patterns in the wafer-like element and allow the connection of individual elements and wiring circuit layers.

The outer peripheral shape of the wiring circuit layer as a whole prior to dicing may be the same as the wafer substrate or a corresponding shape, a shape with even a larger area that can include a plurality of wafer substrates (simple sheets, bands rolled out from a roll, and the like), the same shape as the element assembly region in each wafer substrate or a corresponding shape, and the like.

Supplementary members to locate the wiring circuit layer prior to dicing and the wafer-like element and means to improve the handleability may be added as appropriate.

A metal film for more preferably performing the above-described electrical connection and enhancing the corrosion resistance is preferably formed by plating; useful materials for the metal film include single metals such as copper, gold, silver, platinum, lead, tin, nickel, cobalt, indium, rhodium, chromium, tungsten, and ruthenium, and alloys made of two or more thereof and the like. Preferred materials include gold, tin, nickel and the like; preferred modes of the metal film include a double-layer structure with an underlayer of Ni and a surface layer of Au and the like.

An opening (through hole) is provided for the metal support substrate at a position corresponding to the connecting conductor part, whereby the tip of the connecting conductor part is allowed to protrude from the surface of the insulating layer.

The insulating layer as the insulating part of the wiring circuit layer is preferably a three-layers structure as described above (adhesive layer/base insulating layer/adhesive layer). The base insulating layer is responsible for the mechanical strength of the insulating layer, and serves as the base for circuit pattern formation.

The wiring circuit layer may be a double-layer structure of two adhesive layers only, and may be a multi-layer structure of four layers or more including an additional insulating layer.

When the insulating layer of the wiring circuit layer contains a base insulating layer, examples of useful materials include publicly known synthetic resins such as polyimide resin, acrylic resin, polyether nitrile resin, polyether sulfone resin, epoxy resin, polyethylene terephthalate resin, polyethylene naphthalate resin, and polyvinyl chloride resin, as well as composites of these resins with synthetic fiber cloth, glass cloth, nonwoven glass fabric, microparticles such as of $TiO_2$, $SiO_2$, $ZrO_2$, minerals, and clay, and the like. In particular, preference is given to polyimide resin, epoxy resin, and glass cloth-epoxy resin because a thinner flexible insulating layer with higher mechanical strength and better electrical characteristics (insulating characteristic and the like) is obtained after the metal support layer is peeled and separated.

The thickness of the base insulating layer is preferably 3 to 50 μm.

The material of the first and the second adhesive layer may be an adhesive that does not require heating during bonding, or an adhesive requiring heating (thermoplastic resin, thermosetting resin).

When an adhesive that requires heating during bonding is used, the second adhesive layer for following bonding is preferably an adhesive that does not lose adhesiveness even when heated during preceding bonding of the first adhesive layer. For example, if the adhesive of the second adhesive layer for following bonding is the same thermosetting resin as the first adhesive layer for preceding bonding, the second adhesive layer becomes set simultaneously with heating during preceding bonding, which in turn can make the adhesion impossible.

Preferred embodiments include the following:

(a) Both adhesive layers are formed with a thermoplastic resin.

(b) The first adhesive layer for preceding bonding is formed with a thermosetting resin, and the second adhesive layer for following bonding is formed with a thermoplastic resin.

(c) The first adhesive layer for preceding bonding is formed with a thermoplastic resin or thermosetting resin, and the second adhesive layer for following bonding is formed with a thermosetting resin whose setting temperature is higher than the setting temperature of the resin of the first adhesive layer, so as to prevent the second adhesive layer for following bonding from setting by heating during preceding bonding.

Preferred materials for the first and the second adhesive layers (20a, 20b) include, but are not limited to, thermoplastic resins such as polysulfone, polyether sulfone, polyhydantoin, polyether imide, polyester, polyimide siloxane, and siloxane-modified polyamide imide, as well as epoxy resins, acrylic resins, silicone resins, polyimide resins and the like; these may be used in blends.

Useful epoxy resins include, but are not limited to, epoxy resins blended with a thermoplastic resin, rubber, elastomer and the like, silica hybrids, nano-particle-dispersed epoxy resins and the like.

Examples of useful acrylic resins include, but are not limited to, epoxy acrylate, urethane acrylate, silicone acrylate and the like.

Preferred combinations of materials for the two adhesive layers (material for the adhesive layer for preceding bonding and material for the adhesive layer for following bonding) include a combination of phenol novolak type epoxy resin and thermoplastic polyimide, a combination of bisphenol A novolak type epoxy resin and polyimide silicone, a combination of naphthalene-containing novolak type epoxy resin and siloxane-modified polyamideimide, and the like.

The thickness of each adhesive layer is preferably 1 to 100 μm.

As a formation method of a wiring circuit layer on the first metal support substrate, conventionally known methods for producing circuit substrates or interposers can be employed, such as the semi-additive method and the subtractive method.

By forming a wiring circuit layer on a metal support substrate, the dimensional stability during the manufacturing is increased, and the handleability of thin wiring circuit layers is improved.

Figure 4:
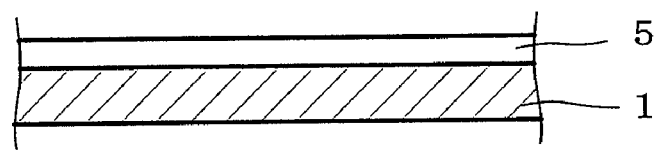
FIG. 4 shows the procedures of processing in Example 1 of the present invention.
Figure 4:
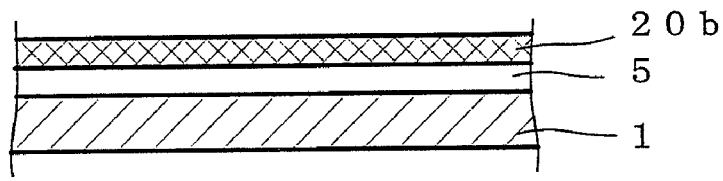
Figure 4:
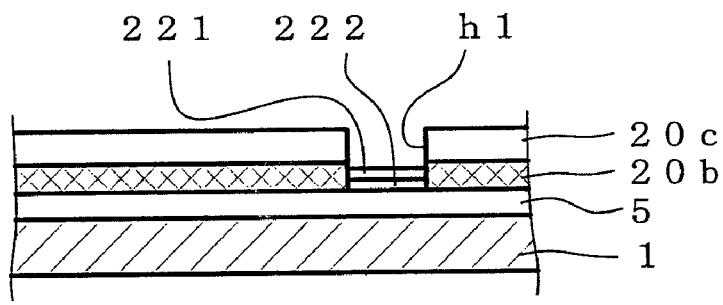
Figure 4:
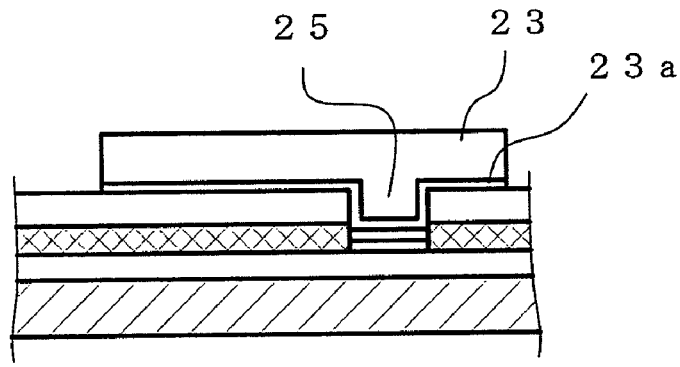
Figure 5:
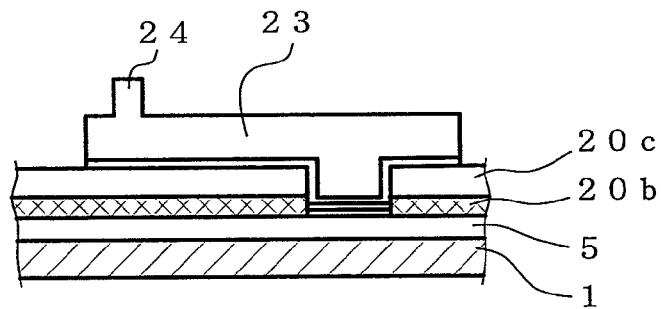
FIG. 5 shows, in continuance to FIG. 4, the procedures of processing in Example 1 of the present invention.
Figure 5:
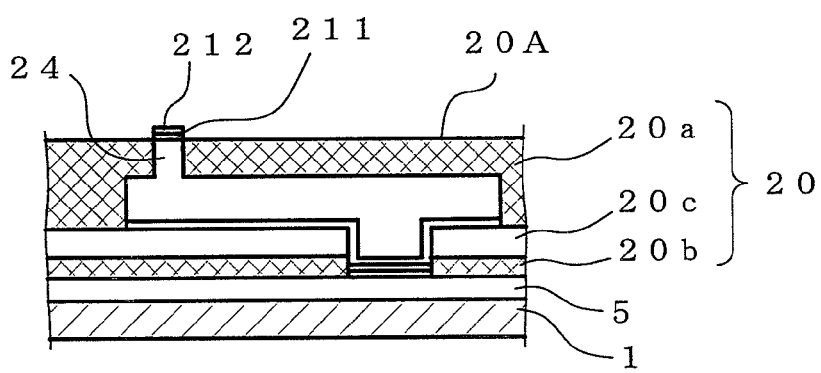
Figure 5:
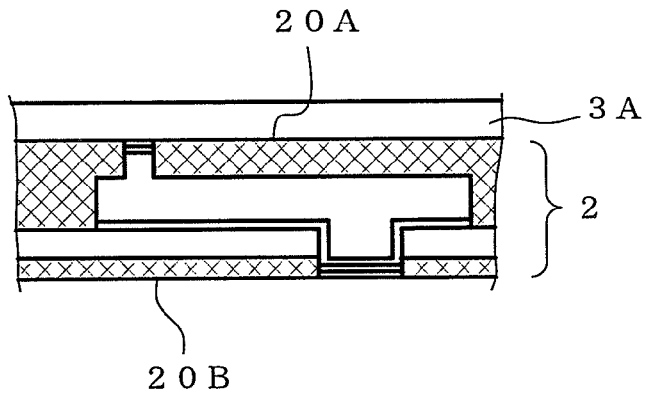
Figure 5:
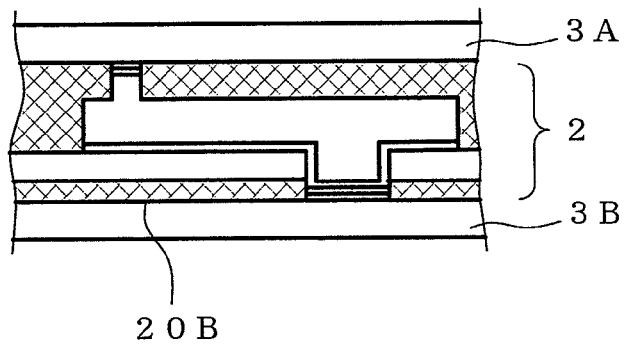
Figure 6:
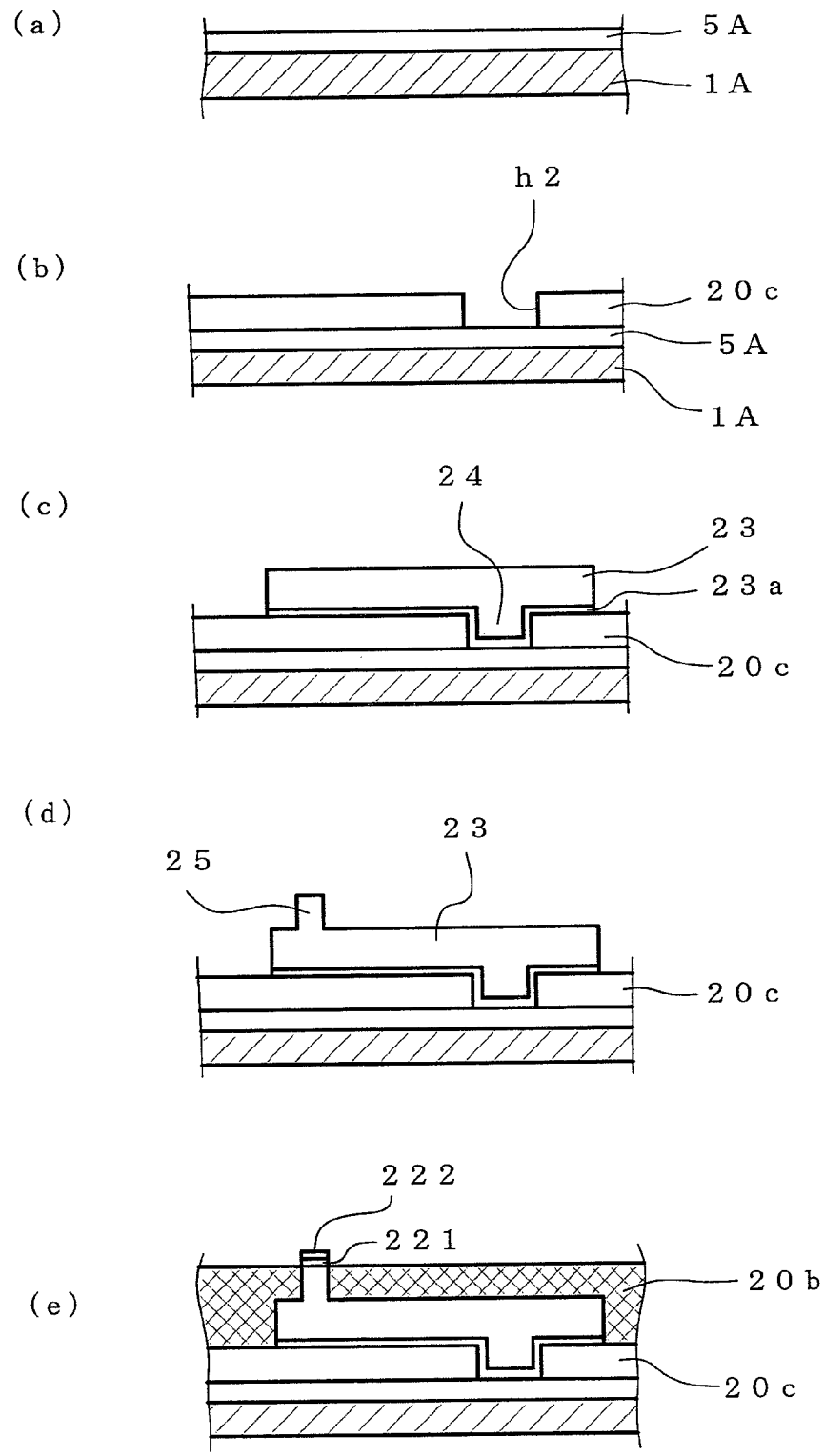
FIG. 6 shows the procedures of processing in Example 2 of the present invention.

When a conductive layer and a conductive path are formed in a wiring circuit layer by the semi-additive method, it is preferable that, as shown in FIGS. 4 to 6, a seed film 23a (metal thin film) for allowing a metal material to deposit well on the conductive layer and the wall surface of the part to constitute the conductive path be formed by sputtering in advance. Examples of useful materials for such a seed film include single metals such as copper, gold, silver, platinum, lead, tin, nickel, cobalt, indium, rhodium, chromium, tungsten, and ruthenium, alloys made of two kinds or more thereof and the like.

Examples of materials for the conductive layer and conductive path shown in FIG. 2 include single metals selected from among copper, gold, silver, platinum, lead, tin, nickel, cobalt, indium, rhodium, chromium, tungsten, ruthenium and the like, and alloys comprising one or more thereof (e.g., solders, nickel-tin, gold-cobalt, and the like). In particular, metals that permit electroplating or electroless plating are preferably used. Copper is preferred because of its excellence in the ease of forming a conductive layer circuit pattern and electrical characteristics.

The thickness of the conductive layer 23 may be chosen as appropriate in, but is not limited to, the range of 1 to 50 μm. The conductive paths 24 and 25 preferably have a cylindrical shape, the diameter thereof being 5 to 500 μm, preferably 5 to 300 μm.

Preferred materials for the first metal support substrate include, but are not limited to, copper, copper alloys based primarily on copper, nickel, nickel alloys based primarily on nickel, alloys based primarily on nickel and iron, stainless steel, and the like.

To minimize the difference in the coefficient of linear expansion from the semiconductor wafer, an alloy based primarily on nickel and iron (e.g., 42 alloy) is preferably used.

The thickness of the first metal support substrate is variable depending on the rigidity of the material, and is preferably about 10 μm to 200 μm, more preferably about 20 μm to 80 μm.

When the thickness of the first metal support substrate is less than 10 μm, creases and wrinkles are likely to occur in the metal support substrate, which in turn reduces the handleability in the roll process. When the thickness of the first metal support substrate exceeds 200 µm, the winding diameter increases due to the rigidity thereof, which in turn hampers the handling in the roll process and also interfere with the processing by etching.

Figure 7:
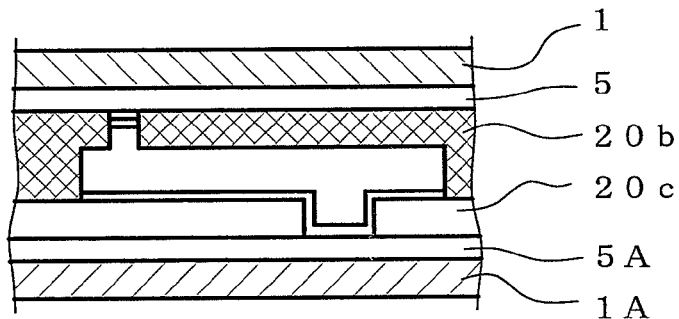
FIG. 7 shows, in continuance to FIG. 6, the procedures of processing in Example 2 of the present invention.
Figure 7:
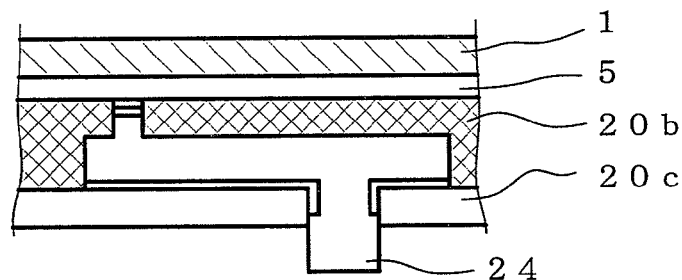
Figure 7:
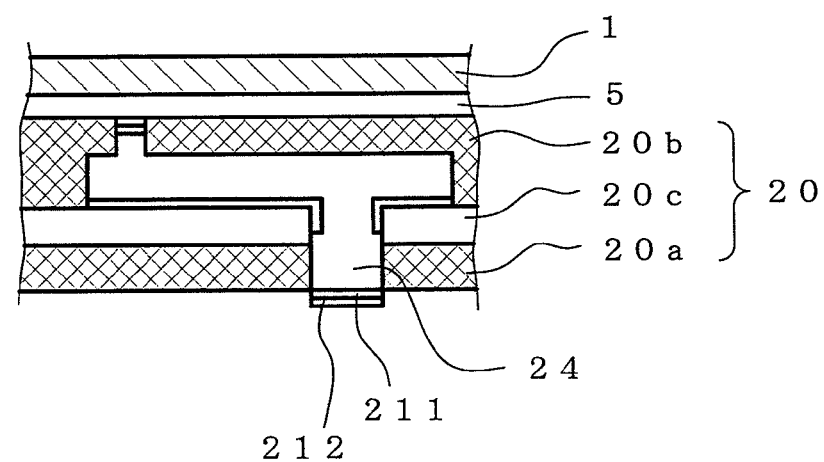

As shown in FIGS. 6 and 7, even when using a second metal support substrate 1A, the second metal support substrate used may be the same as the first metal support substrate described above.

To facilitate the smoother peeling of the first metal support substrate from the wiring circuit layer, a structure is preferable wherein a release layer is present therebetween. It is preferable that the release layer be formed in a way such that the release layer can be peeled from the wiring circuit layer with ease and is not readily peeled from the metal support substrate, and that the release layer is removable, together with the metal support substrate, from the wiring circuit layer.

Useful materials for the release layer include organic substances (silicone resin, polyimide and the like) and inorganic substances (metals, metal oxides, inorganic oxides and the like). The inorganic substances are exemplified by Ag, Ti, W, Ni, $SiO_2$ and the like.

Considering the steps of producing a wiring circuit layer and the high heat conditions during connecting the wiring circuit layer to a semiconductor wafer, greater preference is given to polyimide and the aforementioned inorganic substances because silicone resin can deteriorate.

When the release layer is formed as a polyimide layer, the thickness thereof is preferably 0.1 to 10 µm, with further preference given to 0.1 to 5 µm in preventing the entire wiring circuit layer from bowing.

When the release layer is formed as a layer made of one of the aforementioned inorganic substances, the thickness thereof is preferably 1 to 100 nm, with further preference given to 1 to 50 nm in preventing the entire wiring circuit layer from bowing.

When the release layer is a polyimide layer, useful methods of forming the layer include a method wherein a solution is coated, a method wherein the layer is deposited by electrodeposition or chemical vapor deposition (CVD), a method wherein a separately formed polyimide film is laminated, and the like. When the release layer is a layer made of an inorganic substance such as a metal, metal oxide, or inorganic oxide, useful methods of forming the layer include electroplating, vacuum evaporation, sputtering and the like.

EXAMPLES

The manufacturing method of the present invention is hereinafter described more specifically and in further detail with reference to actual production examples. For all the wiring circuit layers in FIGS. 4 to 7, which are referred to in the following explanation, only one first connecting conductor part and one second connecting conductor part corresponding thereto on the back surface of the latter are enlarged.

Example 1

A release layer of Ti was formed on the first metal support substrate of SUS304, and a wiring circuit layer having an adhesive layer on both surfaces was formed thereon and bonded to a semiconductor wafer.
[Formation of Release Layer]
A release layer 5 of Ti, having a thickness 25 µm, was formed over the entire surface of a stainless steel (SUS304) foil having a thickness of 25 µm as the first metal support substrate 1, by sputtering, as shown in FIG. 4(a).

[Formation of Lower Adhesive Layer (the Second Adhesive Layer) in Insulating Layer]
As shown in FIG. 4(b), a solution of a polyamic acid (prepared by a reaction of oxydiphthalic dianhydride and 2,2-bis(4-aminophenoxyphenyl)propane) was coated on the upper surface of the release layer 5 and thermally set to form the second adhesive layer 20b of a thermoplastic polyimide. The second adhesive layer had a thickness of 5 µm.
[Formation of Base Insulating Layer in Insulating Layer]
A polyamic acid (prepared by a reaction of 3,4',3,4'-biphenyltetracarboxylic dianhydride, 4,4'-diaminodiphenyl ether, and para-phenylenediamine) was coated on the upper surface of the second adhesive layer 20b and thermally set to form a polyimide layer (base insulating layer) 20c having a thickness of 10 µm.
[Formation of Connecting Conductor Part, Seed Film, Lower Conductive Path, and Conductive Layer]
As shown in FIG. 4(c), an opening h1 was formed in the lamination of the adhesive layer 20b and the base insulating layer 20c by laser processing at a position where a second connecting conductor part for connection of a second element is to be formed, to expose the Ti release layer 5 to the bottom of the opening. The opening was spherical with a diameter of 100 µm.

A gold film 222 and a nickel film 221 were sequentially formed by plating on the surface of the Ti release layer 5 exposed to the inside of the opening. The gold film became the metal film on the surface of the lower connecting conductor part.

Furthermore, as shown in FIG. 4(d), sputtering with chromium and then with copper was performed to form a seed film 23a (chromium layer thickness 20 nm, copper layer thickness 100 nm), and a conductive layer 23 and a conductive path 25, in the specified wiring pattern, were formed by electrolytic copper plating.

Since the copper layer of the seed film became unified with the copper of the conductive path and conductive layer, the seed film 23a is illustrated like a single layer of chromium in FIG. 4(d). The same applies to FIGS. 5 to 7.

Subsequently, the portion of the seed film where the conductive layer 23 was absent (the portion of the seed film out of the conductive layer) was removed.
[Formation of Upper Conductive Path]
The seed film was covered with a plating resist over the entire surface except for the portion where a conductive path was to be formed (not illustrated), as shown in FIG. 5(e), and a conductive path 24 having a diameter of 80 µm and a height of 15 µm was formed by electrolytic copper plating.
[Formation of Upper Adhesive Layer (the First Adhesive Layer) in Insulating Layer]
After the plating resist was removed, the first adhesive layer 20a of a thermosetting resin comprising epoxy and polyimide as the primary ingredients was formed in a way such that the exposed conductive layer 23 and conductive path 24 were embedded, as shown in FIG. 5(f), and then the first adhesive layer was etched with an alkaline solution in a way such that the upper end face of the conductive path 24, as the first connecting conductor part, was exposed to the upper surface (the first adhesive surface) of the adhesive layer.
[Formation of Metal Film on the First Connecting Conductor Part]
As shown in FIG. 5(f), a nickel film 211 (thickness 2 µm) and a gold film 212 (thickness 0.5 µm) were sequentially formed by electroplating on the upper end face of the conductive path 24. Although a resist was used for the plating, its description is skipped here.

[Connection to a First Semiconductor Wafer]

The wiring circuit layer thus obtained (the first metal support substrate attached peelably) was connected to a first semiconductor wafer as described below.

The semiconductor wafer had 240 elements, each of which had 240 circular electrode pads 80 μm in diameter, with a gold stud bump 60 μm across formed on each pad.

As shown in FIG. 5(g), a semiconductor wafer 3A was aligned and bonded to the upper main surface (first adhesive surface) 20A of the wiring circuit layers in a vacuum of 3 Pa at a temperature of 200° C. under a pressure of 1.5 g/bump, using an aligner and bonding apparatus (manufactured by EV Group), after which the first adhesive layer was cured at 180° C. for 2 hours. Subsequently, the first metal support substrate 1 and the release layer 5 were peeled off together by separation at the interface between the release layer 5 and the second adhesive layer 20b.

As shown in FIG. 5(h), the second semiconductor wafer 3B same as the above was aligned on the second adhesive surface of the second adhesive layer (the lower main surface 20B of the wiring circuit layer) exposed upon the peeling, as described above, and they were thermally compression-bonded at 300° C. to yield a semiconductor device, which was cut into individual chips by dicing.

In this Example, the first adhesive layer 20a for preceding connection of the first semiconductor wafer was prepared as a layer of a thermosetting resin, and the second adhesive layer 20b for following connection of the second semiconductor wafer was prepared as a layer of a thermoplastic resin. By assuming this configuration, heating during preceding bonding had no influence on following bonding, and a preferred double-side mounted article was obtained.

Example 2 as shown in FIGS. 6 and 7, a second metal support substrate was prepared as a temporary substrate, a part of the wiring circuit layer (layers except the first adhesive layer) was laminated peelably thereon, and the first metal support substrate was further laminated peelably thereon, after which the second metal support substrate was removed, and a first adhesive layer was formed, to obtain a peelable lamination of the metal support substrate and the wiring circuit layer.

[Formation of Second Release Layer on Second Metal Support Substrate]

As shown in FIG. 6(a), using a stainless steel (SUS304) foil having a thickness of 25 μm as the second metal support substrate 1A, the second release layer 5A of Ti, having a thickness of 25 μm, was formed over the entire surface of the substrate 1A, by sputtering.

[Formation of Base Insulating Layer in Insulating Layer]

In this Example, the base insulating layer was formed on the second metal support substrate, the second adhesive layer was formed thereon, the first metal support substrate was formed peelably thereon, and then the second metal support substrate 1A was peeled, after which the first adhesive layer was formed.

As shown in FIG. 6(b), a polyimide layer (base insulating layer) 20c was formed on the second release layer 5A using a light-sensitive polyamic acid (prepared by a reaction of 3,4', 3,4'-biphenyltetracarboxylic dianhydride, 4,4'-diaminodiphenyl ether, and para-phenylenediamine, and containing a photosensitizer). The thickness was 10 μm.

An opening h2 was formed in the base insulating layer 20c at a position for formation of a second connecting conductor part for connection of a second element, by laser processing to expose the second release layer (Ti layer) 5A to the bottom of the opening. The opening was spherical with a diameter of 100 μm.

[Formation of Seed Film, a Portion of Lower Conductive Path, and Conductive Layer]

As shown in FIG. 6(c), sputtering was performed with chromium and then with copper to form a seed film 23a, and a portion 24 of the lower conductive path and a conductive layer 23 being the specified wiring pattern were formed by electrolytic copper plating.

Subsequently, the portion of the seed film where the conductive layer 23 was absent (the portion of the seed film out of the conductive layer) was removed.

[Formation of Upper Conductive Path]

In the same manner as the above-described Example 1, the seed film was covered with a plating resist over the entire surface except for the portion for formation of a conductive path (not illustrated), and a conductive path (metal column) 25 having a diameter of 80 μm and a height of 15 μm was formed by electrolytic copper plating, as shown in FIG. 6(d).

[Formation of the Second Adhesive Layer in Insulating Layer]

After the plating resist was removed, a solution of a polyamic acid (prepared by a reaction of oxydiphthalic dianhydride and 2,2-bis(4-aminophenoxyphenyl)propane) was coated and thermally set to form the second adhesive layer 20b of a thermoplastic polyimide in a way such that the exposed conductive layer 23 and conductive path 25 were embedded, as shown in FIG. 6(e). Subsequently, the adhesive layer was etched with an alkaline solution in a way such that the upper end face of the conductive path 25, as the second connecting conductor part, was exposed in the upper surface (the second adhesive surface) of the second adhesive layer. The second adhesive layer had a thickness of 5 μm.

[Formation of Metal Film on Upper End Face of Upper Conductive Path]

As shown in FIG. 6(e), a nickel film 221 (thickness 2 μm) and a gold film 222 (thickness 0.5 μm) were sequentially formed on the upper end face of the conductive path 25 by electroplating. A resist was used for the plating as in Example 1.

[Bonding of Metal Support Substrate]

Separately, using a stainless steel (SUS304) foil as a metal support substrate 1, the foil having a thickness of 25 μm same as the second metal support substrate 1A, and a release layer 5 of Ti, having a thickness of 25 μm, was formed thereon over the entire surface by sputtering.

This two-layers lamination of the first metal support substrate 1 and release layer 5 was thermally compression-bonded to the upper surface (the second adhesive surface, or the second main surface 20B) of the second adhesive layer 20b formed as described above, as shown in FIG. 7(f).

[Peeling of Second Metal Support Substrate and Formation of Lower Conductive Path]

As shown in FIG. 7(g), the second metal support substrate 1A and the second release layer 5A, were peeled off together by separation at the interface between the release layer 5A and the base insulator layer 20c.

The lower end surface of the chromium seed film formed on the bottom of the opening h2 was exposed to the lower surface of the base insulator layer 20c exposed upon the peeling. After removing the chromium seed film, a lower conductive path (metal column) 24 having a diameter of 100 μm and a height of 15 μm was further formed by electrolytic copper plating using a plating resist, as shown in FIG. 7(g).

[Formation of the First Adhesive Layer in Insulating Layer]

After the plating resist was removed, the first lower adhesive layer 20a of a thermosetting resin comprising epoxy and polyimide as the primary ingredients was formed in a way such that the exposed base insulator layer 20c and conductive path 24 were embedded, as shown in FIG. 7(h). Subsequently, the first adhesive layer was etched with an alkaline solution in a way such that the lower end face of the conductive path 24, as a first connecting conductor part, was exposed to the lower surface (the first adhesive surface) of the first adhesive layer. The first adhesive layer had a thickness of 5 μm.

[Formation of Metal Film on Surface of the First Connecting Conductor Part]

As shown in FIG. 7(h), a nickel film 211 (thickness 2 μm) and a gold film 212 (thickness 0.5 μm) were sequentially formed by electroplating on the surface of the lower connecting conductor part. Although a resist was used for the plating, its description is skipped here.

[Connection to Semiconductor Wafers]

To the wiring circuit layer thus obtained (the metal support substrate attached peelably), two semiconductor wafers ware each connected to the both main surfaces, using the same procedures as Example 1, and the wafer was cut into semiconductor devices in the form of individual chips by dicing.

The two adhesive layers in the wiring circuit layer finally obtained in this Example were identical to those in Example 1 in terms of the positional relationship between them and the first metal support substrate; the first adhesive layer 20a for preceding connection of the first semiconductor wafer was a layer of a thermosetting resin, and the second adhesive layer 20b for following connection of the second semiconductor wafer was of a thermoplastic resin. With this configuration, heating during preceding bonding had no influence on following bonding, and a preferred double-side mounted article was obtained.

According to the manufacturing method of the present invention, a redistribution layer can be provided for a semiconductor element at lower cost, and disposal of semiconductor elements of acceptable quality because of unacceptable quality of the redistribution layer is avoidable. The manufacturing method also enables the mounting of elements on both faces of a semiconductor device, resulting in increased mounting density.

This application is based on a patent application No. 2009-080023 filed in Japan, the contents of which are incorporated in full herein by this reference.

The invention claimed is:

1. A method for manufacturing a semiconductor device having a laminated structure comprising a first semiconductor element and a wiring circuit layer,
    wherein the wiring circuit layer comprises a wiring part, an insulating part, and first and second main surfaces,
    wherein the first semiconductor element is laminated and connected to the first main surface of the wiring circuit layer, and
    wherein the insulating part has a laminated structure comprising a first adhesive layer, a second adhesive layer, and a base insulating layer between the first and second adhesive layers, wherein the first adhesive layer is disposed on the first main surface of the wiring circuit layer and the second adhesive layer is disposed on the second main surface of the wiring circuit layer, and the first and second main surfaces form a first adhesive surface and a second adhesive surface by the presence of the first adhesive layer and the second adhesive layer, respectively;
    which method comprises the steps of:
    (a) laminating the wiring circuit layer on a first metal support substrate, wherein the first adhesive surface is provided on an opposite side of the wiring circuit layer from the first metal support substrate,
    wherein the laminating step comprises
        (1) forming the base insulating layer on a second metal support substrate,
        (2) forming the wiring part and the second adhesive layer covering the wiring part,
        (3) laminating the first metal support substrate peelably on the second adhesive surface, which is the upper surface of the second adhesive layer,
        (4) peeling the second metal support substrate,
        (5) forming the first adhesive layer on the exposed surface of the base insulating layer, and then
        (6) forming a first connecting conductor part in the first adhesive surface which is the lower surface of the first adhesive layer;
    (b) after the laminating step, bonding the first semiconductor element in a wafer state to the first adhesive surface, and simultaneously connecting an electrode of the first semiconductor element to the first connecting conductor part exposed in at least the first adhesive surface, wherein the first connecting conductor part constitutes a portion of the wiring part of the wiring circuit layer or is connected to the wiring part via a conductive path; and
    (c) peeling the first metal support substrate from the wiring circuit layer after the bonding step.

2. The method according to claim 1,
    which method further comprises, after the peeling step,
    (d) bonding a second semiconductor element in a wafer state or chip state to the second adhesive surface exposed in the peeling step, and simultaneously connecting an electrode of the second semiconductor element to a second connecting conductor part exposed in the second main surface of the wiring circuit layer, wherein the second connecting conductor part constitutes a portion of the wiring part of the wiring circuit layer or is connected to the wiring part via a conductive path.

3. The method according to claim 1, wherein
    (i) both the first adhesive layer and the second adhesive layer are made of thermoplastic resin, or
    (ii) the first adhesive layer is formed with a thermosetting resin, and the second adhesive layer is formed with a thermoplastic resin, or
    (iii) the first adhesive layer is formed with a thermoplastic resin or thermosetting resin having a first setting temperature, and the second adhesive layer is formed with a thermosetting resin having a second setting temperature wherein the second setting temperature is higher than the first setting temperature.

4. The method according to claim 1, wherein a release layer is present between the first metal support substrate and the wiring circuit layer.

5. The method according to claim 4, wherein a first force for peeling the release layer from the wiring circuit layer is smaller than a second force for peeling the release layer from the first metal support substrate, thereby allowing the release layer to be peeled, together with the first metal support substrate, from the wiring circuit layer.

6. The method according to claim 4, wherein the release layer is made of a polyimide.

7. The method according to claim 4, wherein the release layer is made of one material selected from among metals, metal oxides, and inorganic oxides.

8. The method according to claim 1, wherein the wiring circuit layer is a redistribution layer for the first semiconductor element connected thereto.

* * * * *